(12) United States Patent
Yang

(10) Patent No.: US 11,121,333 B2
(45) Date of Patent: Sep. 14, 2021

(54) OLED DISPLAY PANEL AND METHOD FOR FABRICATING SAME

(71) Applicant: WUHAN CHINA STAR OPTOELECTRONICS SEMICONDUCTOR DISPLAY TECHNOLOGY CO., LTD., Wuhan (CN)

(72) Inventor: Hanning Yang, Wuhan (CN)

(*) Notice: Subject to any disclaimer, the term of this patent is extended or adjusted under 35 U.S.C. 154(b) by 0 days.

(21) Appl. No.: 16/649,671

(22) PCT Filed: Jan. 8, 2020

(86) PCT No.: PCT/CN2020/070812
§ 371 (c)(1),
(2) Date: Mar. 23, 2020

(87) PCT Pub. No.: WO2021/051728
PCT Pub. Date: Mar. 25, 2021

(65) Prior Publication Data
US 2021/0091319 A1     Mar. 25, 2021

(30) Foreign Application Priority Data
Sep. 16, 2019   (CN) .......................... 201910871182.2

(51) Int. Cl.
*H01L 51/00*   (2006.01)
*H01L 51/56*   (2006.01)
*H01L 27/32*   (2006.01)

(52) U.S. Cl.
CPC ...... *H01L 51/0097* (2013.01); *H01L 27/3276* (2013.01); *H01L 51/56* (2013.01)

(58) Field of Classification Search
None
See application file for complete search history.

(56) References Cited

U.S. PATENT DOCUMENTS

| 2016/0204183 A1* | 7/2016 | Tao ..................... H01L 27/3276 257/40 |
| 2016/0268542 A1 | 9/2016 | Suzuki |
| 2016/0374193 A1 | 12/2016 | Namkung |
| 2017/0047547 A1* | 2/2017 | Son ........................ H01L 25/167 |
| 2018/0217639 A1* | 8/2018 | Jones ..................... G06F 1/1652 |
| 2019/0096913 A1* | 3/2019 | Lee ....................... H01L 27/1218 |
| 2019/0189640 A1 | 6/2019 | Huang et al. |
| 2020/0119116 A1 | 4/2020 | Kim et al. |

(Continued)

FOREIGN PATENT DOCUMENTS

| CN | 104425550 A | 3/2015 |
| CN | 107894681 A | 4/2018 |

(Continued)

*Primary Examiner* — J. E. Schoenholtz

(57) ABSTRACT

The invention provides an OLED display panel and a method for manufacturing the same. The OLED display panel includes a flexible substrate. The surface of the flexible substrate defines a display area, a bending area, and a binding area. A signal wiring layer is provided in the bending area. A buffer layer comprising patterned holes is provided on the flexible substrate corresponding to the bending area, and the neutral layer of the bending area is adjusted into the signal wiring layer to prevent the signal wiring from being broken and improve the anti-bending performance.

14 Claims, 6 Drawing Sheets

(56) References Cited

U.S. PATENT DOCUMENTS

2020/0194712 A1* 6/2020 Choi .................... H01L 51/529
2020/0287169 A1* 9/2020 Sung ................... H01L 51/0097

FOREIGN PATENT DOCUMENTS

| CN | 108598135 A | 9/2018 |
| CN | 109494314 A | 3/2019 |
| CN | 109801562 A | 5/2019 |
| CN | 110047881 A | 7/2019 |
| CN | 110197845 A | 9/2019 |

\* cited by examiner

OLED DISPLAY PANEL AND METHOD FOR FABRICATING SAME

FIELD OF INVENTION

The present invention relates to a display technology, and more particularly to an OLED display panel and a method for fabricating the same.

BACKGROUND

In flat panel display technology, organic light-emitting diode (OLED) displays have many advantages such as light weight, active light emission, fast response times, wide viewing angles, wide color gamut, high brightness, and low power consumption, so they have gradually become the third-generation display technology after liquid crystal displays.

With the continuous development of technology and the increasing demand for narrow bezel products, reducing the lower bezel of the display through pad bending has become an effective technical means. However, when the bending area of the OLED display panel has a small bending radius, the signal traces inside the OLED display panel are more susceptible to stress damage and breakage, which in turn causes defective display area of the OLED display panel.

As shown in FIG. 1, a signal routing layer 105'(including metal wiring such as scanning lines and data lines) in a bending area 103' of an existing OLED display panel 100' is a metal wire above an interlayer dielectric layer (ILD) 106' with a specific shape obtained by processing, and because the material of a flexible substrate 101' of the OLED display panel 100 generally has a high Young's modulus, resulting in the inconvenience of the neutral layer 109' of the bending area 103' of the OLED display panel 100' is below the signal routing layer 105'. When the bending area 103' is bent, the signal routing within the signal routing layer 105' is susceptible to stress damage and causes circuit breakage, thereby causing poor display of the OLED display panel 100' (defects such as bright lines and bright spots).

In summary, it is necessary to provide a new OLED display panel and a method for fabricating the same to solve the above technical problems.

SUMMARY

The present invention provides an OLED display panel and a method for fabricating the same, which solves the problem that because the material of the flexible substrate of an OLED display panel has a high Young's modulus, resulting in the neutral layer of the bending area to be below the signal wiring layer and when the bending area is bent, the signal wiring is susceptible to stress damage and circuit breakage, which further causes a technical problem of poor display of the OLED display panel.

In view of this, the present invention provides the following technical solutions.

An embodiment of the present invention provides an OLED display panel, comprising a flexible substrate comprising a display area defined over a front-side surface the flexible substrate, a bending region located at one end of the display area, and a binding region located over a back surface of the flexible substrate, wherein the bending region is configured to be bendable to the binding region, a signal wiring layer is provided in the bending region, the signal wiring layer connects the display region and the binding region, and the signal wiring layer comprises a plurality of signal wires; and wherein a buffer layer is disposed over the flexible substrate at a position corresponding to the bending region, and the buffer layer is configured to adjust a position of a neutral layer of the bending region into the signal wiring layer.

In the OLED display panel provided by an embodiment of the present invention, the buffer layer is disposed at a side of the flexible substrate facing away from the signal wiring layer.

In the OLED display panel provided by an embodiment of the present invention, the buffer layer is composed of a plurality of patterned holes.

In the OLED display panel provided by an embodiment of the present invention, a Young's modulus of the flexible substrate located in the bending region is smaller than a Young's modulus of the flexible substrate located in the display area and the binding region.

In the OLED display panel provided by an embodiment of the present invention, the OLED display panel further comprises a first backplate and a second backplate, wherein the first backplate and the second backplate are disposed on the backside surface of the flexible substrate, and the first backplate and the second backplate are respectively disposed at two ends of the buffer layer.

In the OLED display panel provided by an embodiment of the present invention, the first backplate and the second backplate are made of polyethylene terephthalate.

In the OLED display panel provided by an embodiment of the present invention, the flexible substrate is made of polyimide.

An embodiment of the present invention, comprising:
a flexible substrate, comprising a display area defined over a front-side surface the flexible substrate, a bending region located at one end of the display area, and a binding region located over a back surface of the flexible substrate, wherein the bending region is configured to be bendable to the binding region, and a signal wiring layer is provided in the bending region; and wherein a buffer layer is disposed over the flexible substrate at a position corresponding to the bending region, and the buffer layer is configured to adjust a position of a neutral layer of the bending region into the signal wiring layer.

In the OLED display panel provided by an embodiment of the present invention, the buffer layer is disposed at a side of the flexible substrate facing away from the signal wiring layer.

In the OLED display panel provided by an embodiment of the present invention, a Young's modulus of the flexible substrate located in the bending region is smaller than a Young's modulus of the flexible substrate located in the display area and the binding region.

In the OLED display panel provided by an embodiment of the present invention, a Young's modulus of the flexible substrate located in the bending region is smaller than a Young's modulus of the flexible substrate located in the display area and the binding region.

In the OLED display panel provided by an embodiment of the present invention, the first backplate and the second backplate are made of polyethylene terephthalate.

In the OLED display panel provided by an embodiment of the present invention, the flexible substrate is made of polyimide.

An embodiment of the present invention provides a method for fabricating an OLED display panel, comprising following steps:

S10: fabricating a sacrificial layer over a glass corresponding to a bending region, the sacrificial layer is composed of a plurality of nanoparticles, and a flexible substrate is fabricated over the sacrificial layer and the glass;

S20: fabricating a film structure of the OLED display panel comprising a signal wiring layer over the flexible substrate;

S30: forming a buffer layer over the flexible substrate at a position corresponding to the bending region, wherein the buffer layer is configured to adjust a position of a neutral layer of the bending region into the signal wiring layer; and S40: laminating a first backplate and a second backplate over the flexible substrate, and the first backplate and the second backplate are attached to two ends of the buffer layer, respectively.

In the method for fabricating an OLED display panel provided by an embodiment of the present invention, in the step S10, a plurality of the nanoparticles is doped in a polyimide solution and the sacrificial layer is formed by coating thereof.

In the method for fabricating an OLED display panel provided by an embodiment of the present invention, the step S30 comprises:

S301: performing a laser scanning irradiation on the sacrificial layer, transforming the sacrificial layer is into a carbonized layer, and peeling off the carbonized layer with the glass;

S302: scanning the OLED display panel with a laser, and separating the glass from the flexible substrate; and S303: cleaning the carbonized layer, forming a plurality of patterned holes over the flexible substrate, and the plurality of patterned holes are the buffer layer.

In the method for fabricating an OLED display panel provided by an embodiment of the present invention, a size of the patterned holes in the buffer layer is 1 to 2 times of a size of the nanoparticles.

In the method for fabricating an OLED display panel provided by an embodiment of the present invention, the laser is an ultraviolet laser.

In the method for fabricating an OLED display panel provided by an embodiment of the present invention, a thickness of the sacrificial layer is 100 nm to 10 μm.

The beneficial effects of the present invention are that the OLED display panel provided by the present invention and the method thereof are provided with a buffer layer composed of a patterned cavity over a flexible substrate corresponding to the bending area to adjust the neutral layer into a signal routing layer to prevent the signal wiring from stress damage and breakage, which improves the bending resistance of the bending area, thereby improving the service life of the OLED display panel.

BRIEF DESCRIPTION OF DRAWINGS

To detailly explain the technical schemes of the embodiments or existing techniques, drawings that are used to illustrate the embodiments or existing techniques are provided. Apparently, the illustrated embodiments are just a part of those of the present disclosure. It is easy for any person having ordinary skill in the art to obtain other drawings without labor for inventiveness.

DETAILED DESCRIPTION

Figure 1:
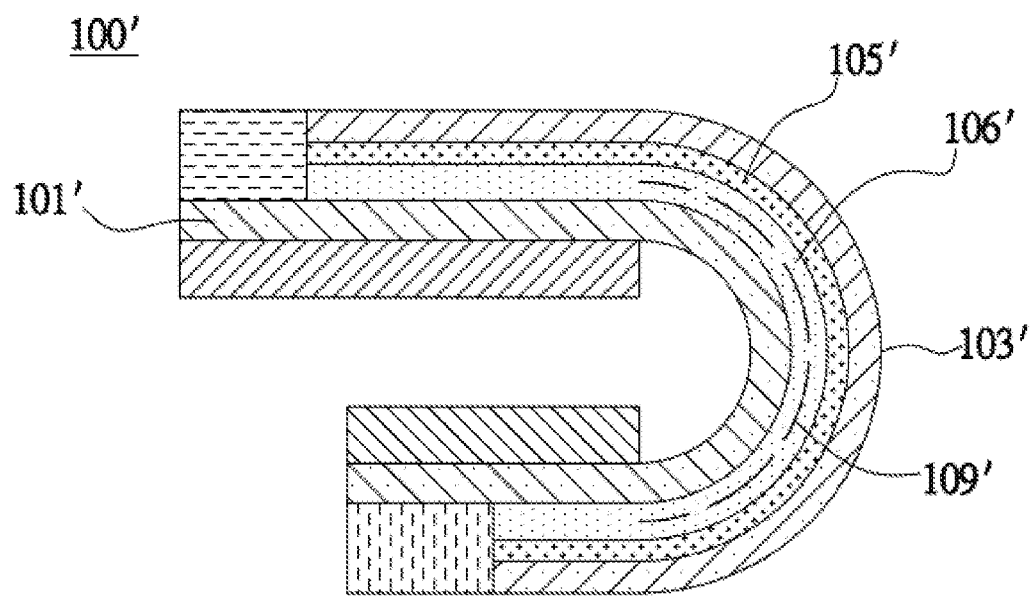
FIG. 1 is a schematic cross-sectional structural diagram of an OLED display panel in the prior art.

The following description is based on the specific embodiments of the present invention as illustrated and should not be construed as limiting the specific embodiments that are not described herein. The directional terms mentioned in the present invention, such as "upper", "lower", "before", "after", "left", "right", "inside", "outside", "side", etc., are only used to show direction in the figures. The directional terms used in the drawings are used to explain and explain the invention and are not intended to limit the scope of the invention.

The present invention is directed to an OLED display panel and a method for fabricating the same, which solves the problem that because the material of the flexible substrate of an OLED display panel has a high Young's modulus, resulting in the neutral layer of the bending area to be below the signal wiring layer and when the bending area is bent, the signal wiring is susceptible to stress damage and circuit breakage, which further causes a technical problem of poor display of the OLED display panel.

Embodiment 1

Figure 2:
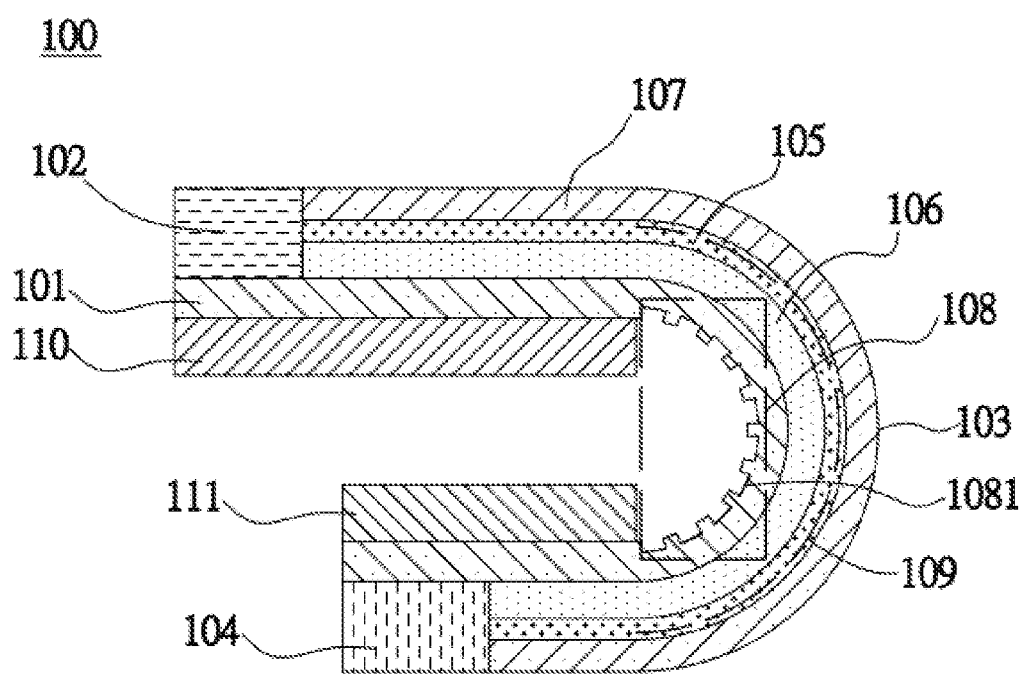
FIG. 2 is a schematic cross-sectional structural diagram of an OLED display panel according to a first embodiment of the present invention.

As shown in FIG. 2, an embodiment of the present invention provides an OLED display panel 100 comprising a flexible substrate 101 comprising a display area 102 defined over a front surface the flexible substrate 101, a bending region 103 located at one end of the display area 102, and a binding region 104 located over a back-side surface of the flexible substrate 101, wherein the bending region 103 is configured to be bendable to the binding region 104. A signal wiring layer 105 is provided in the bending region 103, and the signal wiring layer 105 connects the display area 102 and the binding region 104. Typically, the signal wiring layer 105 comprises a plurality of signal wires, such as metal lines of scanning lines and data lines.

Furthermore, the flexible substrate 101 is further provided with a thin film transistor array layer, and an interlayer dielectric layer (ILD) 106 is disposed over the thin film transistor array layer. The signal wiring layer 105 is disposed over the ILD layer 106, and a planarization layer (PLN) 107 is disposed over the signal wiring layer 105. A pixel definition layer is disposed over the PLN layer 107, an OLED display layer is disposed on the pixel defining layer, and an encapsulation layer is disposed on the OLED display layer.

Furthermore, a buffer layer 108 is disposed over the flexible substrate 101 at a position corresponding to the bending region 103, and the buffer layer 108 is configured to adjust a position of a neutral layer 109 of the bending region 103 into the signal wiring layer 105. This allows that the signal routing layer 105 is disposed over the neutral layer 109 of the bending region 103 when the bending region 103 is being bent. An area below the neutral layer 109 in the OLED display panel 100 is pressed and this generates compressive stress, while the area above the neutral layer 109 is stretched and this generates tensile stress. The area below the neutral layer 109 is subjected to compressive stress, which cancels out the tensile stress received by the area above the neutral layer 109 so that the total stress at the signal wiring layer 105 is zero, thereby reducing the risk of breaking the signal wiring.

Specifically, in the embodiment of the present invention, the buffer layer 108 is disposed at a side of the flexible substrate 101 facing away from the signal wiring layer 105. The buffer layer 108 comprises a plurality of patterned holes 1081 so that a thickness of the flexible substrate 101 corresponding to the bending region 103 is less than the thickness of the flexible substrate 101 corresponding to the display region 102 and the binding region 104, thereby reducing the thickness of the flexible substrate 101 in the bending region 103, and making a Young's modulus of the flexible substrate 101 located in the bending region 103 less than a Young's modulus of the flexible substrate 101 located in the display area 102 and the binding region 104. Therefore, the location of the neutral layer 109 in the bending region 103 is moved up into the signal wiring layer 105 so that the stress of the signal wiring in the signal wiring layer 105 is zero, thereby reducing the risk of breaking the signal wires.

The OLED display panel 100 further comprises a first backplate 110 and a second backplate 111, wherein the first backplate 110 and the second backplate 111 are disposed on the back surface of the flexible substrate 101, and the first backplate 110 and the second backplate 111 are respectively disposed at two ends of the buffer layer 108. The first backplate 110 and the second backplate 111 support and protect the OLED display panel 100.

In one embodiment of the present invention, the flexible substrate is made of polyimide, which is advantageous to improve the bending performance of the OLED display panel 100. The first backplate 110 and the second backplate 111 are made of polyethylene terephthalate.

Embodiment 2

Figure 3:
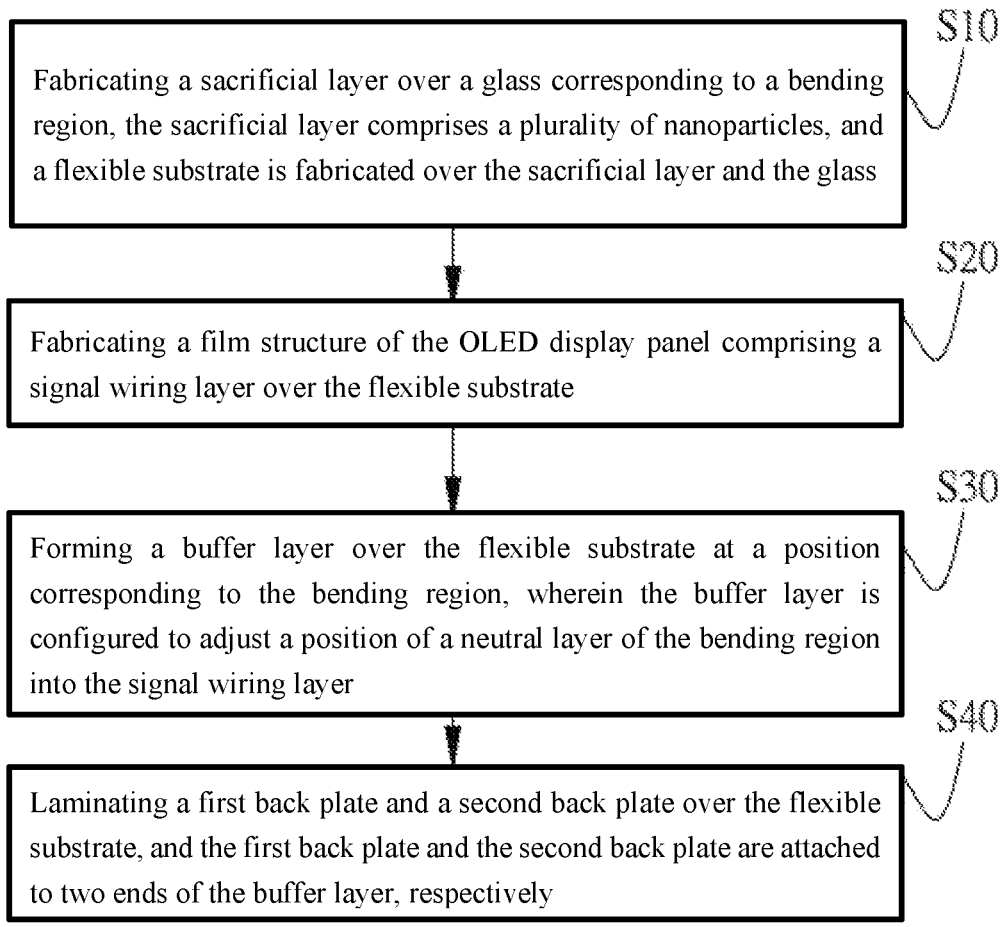
FIG. 3 is a flowchart of a method for fabricating an OLED display panel according to a second embodiment of the present invention.

As shown in FIG. 3, an embodiment of the present invention provides a method for fabricating the OLED display panel 100, comprising following steps:

S10: fabricating a sacrificial layer 113 over a glass 112 corresponding to a bending region 103, wherein the sacrificial layer 113 comprises a plurality of nanoparticles 1131, and a flexible substrate 101 is fabricated over the sacrificial layer 113 and the glass 112.

Figure 4A:
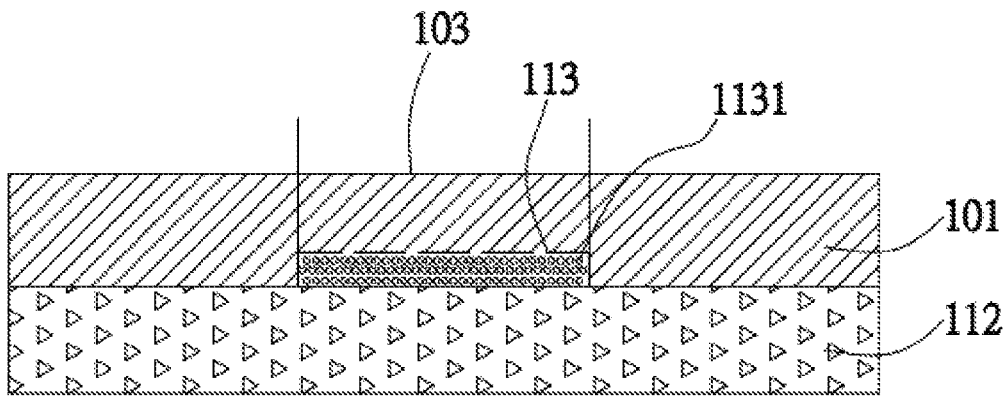
FIG. 4A-4G are schematic diagrams of the method for fabricating the OLED display panel according to the second embodiment of the present invention.

Specifically, as shown in FIG. 4A, the flexible substrate 101 at the bending region 103 generally comprises a plurality of PI layers. Therefore, when the lowest PI layer is coated over the glass 112, a plurality of the nanoparticles 1131 are doped into the PI liquid, and the lowest PI layer of the flexible substrate 101 corresponding to the bending region 103 is converted into the sacrificial layer 113. A thickness of the sacrificial layer 113 is 100 nm-10 μm, and the sacrificial layer 113 is disposed between the flexible substrate 101 and the glass 112.

Next, the remaining PI layers are coated over the sacrificial layer 113 and the glass 112 corresponding to the OLED display panel 100 except the bending region 103 to form a complete flexible substrate 101.

S20: fabricating a film structure of the OLED display panel 100 comprising a signal wiring layer 105 over the flexible substrate 101.

Figure 4B:
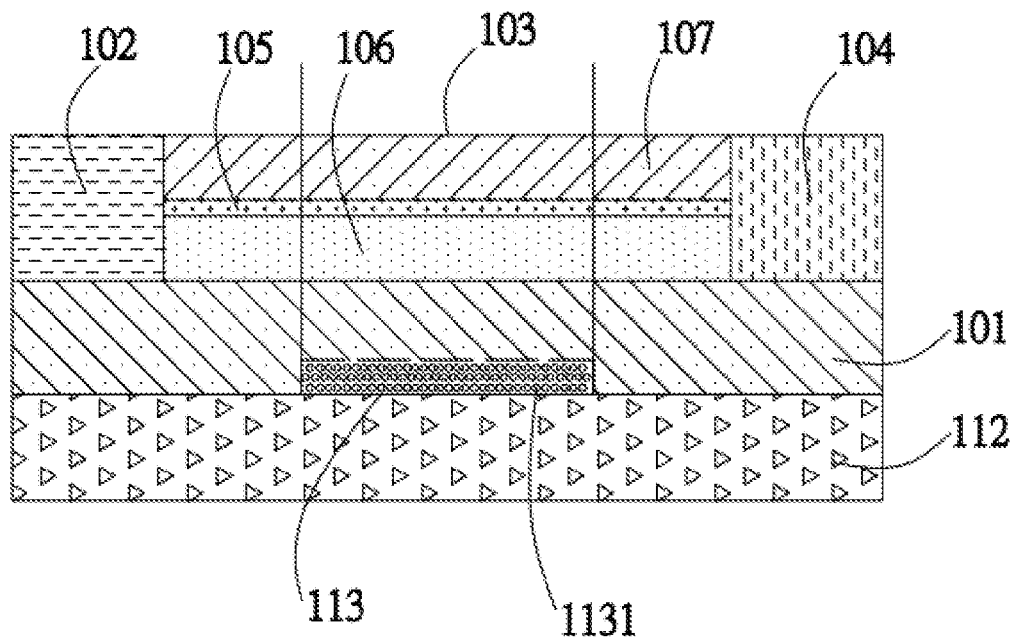

As shown in FIG. 4B, a corresponding array substrate (Array) process and an electroluminescence (EL) process are performed on the flexible substrate 101 to fabricate a film structure of the OLED display panel 100. The above film structure comprises a thin film transistor array layer formed over the flexible substrate 101, an ILD layer 106 formed over the thin film transistor array layer, the signal wiring layer 105 formed over the ILD layer 106, a PLN layer 107 formed over the signal routing layer 105, a pixel definition layer formed over the PLN layer 107, an OLED display layer formed over the pixel definition layer; and an encapsulation layer formed over the OLED display.

Figure 4C:
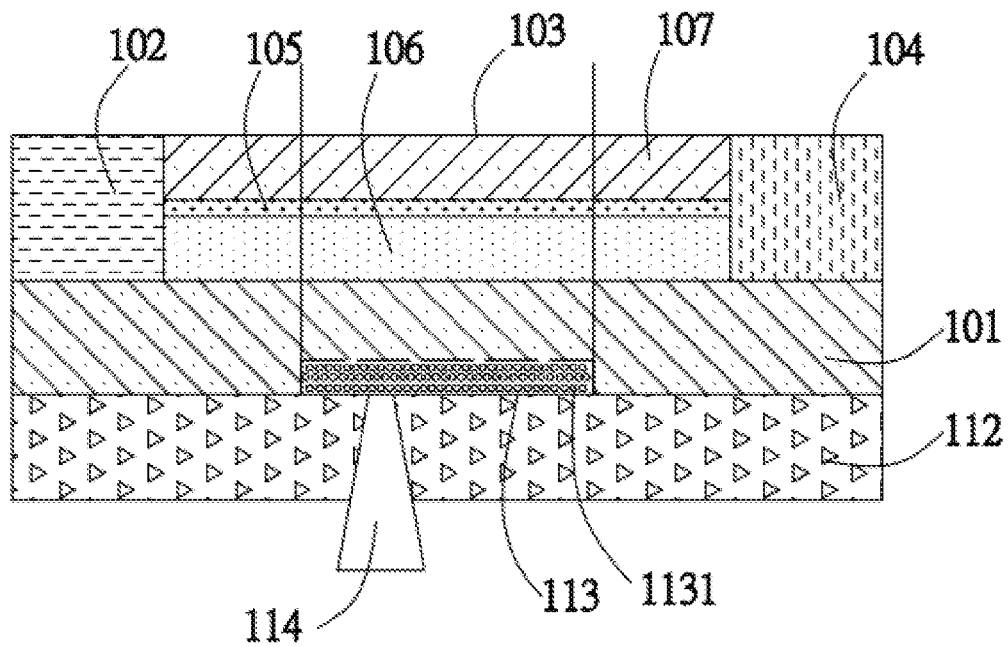
Figure 4D:
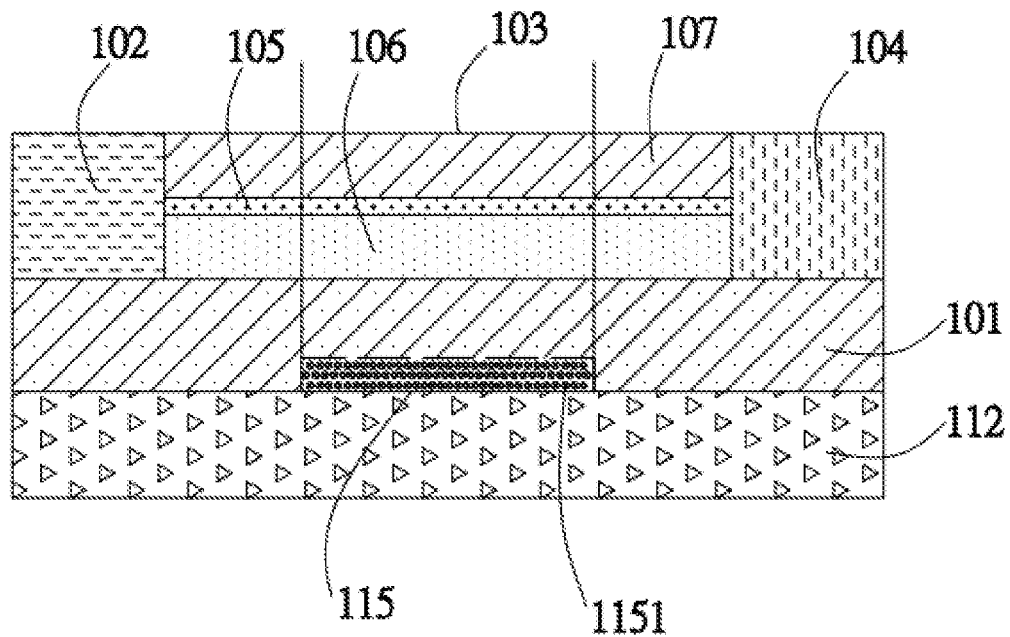

S30: forming a buffer layer 108 over the flexible substrate 101 at a position corresponding to the bending region 103, wherein the buffer layer 108 is configured to adjust a position of a neutral layer 109 of the bending region 103 into the signal wiring layer 105. The step S30 comprises following steps:

S301: performing a laser scanning irradiation on the sacrificial layer 113, transforming the sacrificial layer 113 into a carbonized layer 115, and peeling the carbonized layer 115 and the glass 112;

Specifically, as shown in FIG. 4C and FIG. 4D, the sacrificial layer 113 may be scanned and irradiated with a laser 114. The laser 114 uses ultraviolet light, and the laser 114 passes through the glass 112 and irradiates the sacrificial layer 113. The nanoparticles 1131 in the sacrificial layer 113 interact with the laser 114 to generate a thermal effect, thereby carbonizing the PI material disposed around the nanoparticles 1131. When all the PI materials disposed around the nanoparticles 1131 are carbonized, spherical carbides 1151 are generated around the nanoparticles 1131, and a structure comprising a plurality of the carbides 1151 is the carbonized layer 115 transformed from the sacrificial layer 113. At the same time, the interaction force between the sacrificial layer 113 and the glass 112, such as the Van der Waals force, is also destroyed accordingly, so that laser peeling can be achieved between the sacrificial layer 113 and the glass 112.

Furthermore, since the resonance wavelength that causes the nanoparticle 1131 to interact with the laser 114 to generate a thermal effect is related to the shape, size, and property of the nanoparticle 1131, the above parameters of the nanoparticle 1131 can be changed by converting the working wavelength of the laser 114 from an ultraviolet band to a visible and infrared band, which can reduce the working energy when the laser 114 is performing laser peeling, and further reduce the equipment cost of laser peeling.

S302: scanning the OLED display panel with the laser 114 and separating the glass 112 from the flexible substrate 101.

Figure 4E:
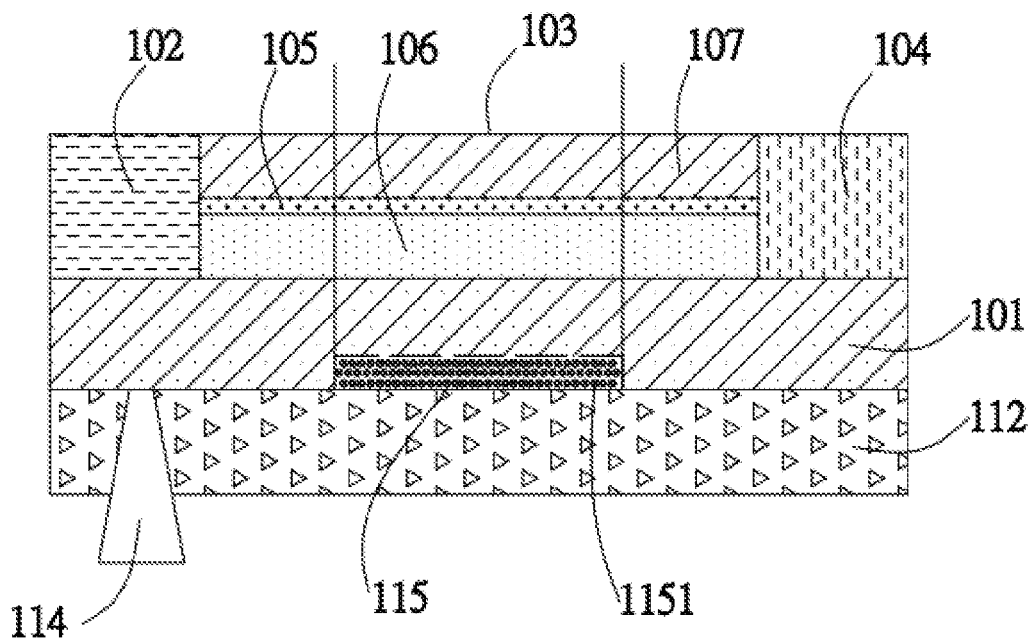

As shown in FIG. 4E, the laser 114 is an ultraviolet laser, and the laser 114 irradiates the bottom of the flexible substrate 101 through the glass 112. The flexible substrate 101 and the laser 114 react with each other so that the glass 112 is separated from the flexible substrate 101.

S303: cleaning the carbonized layer 115, forming a plurality of patterned holes 1081 over the flexible substrate 101, wherein the plurality of patterned holes 1081 are the buffer layer 108.

Figure 4F:
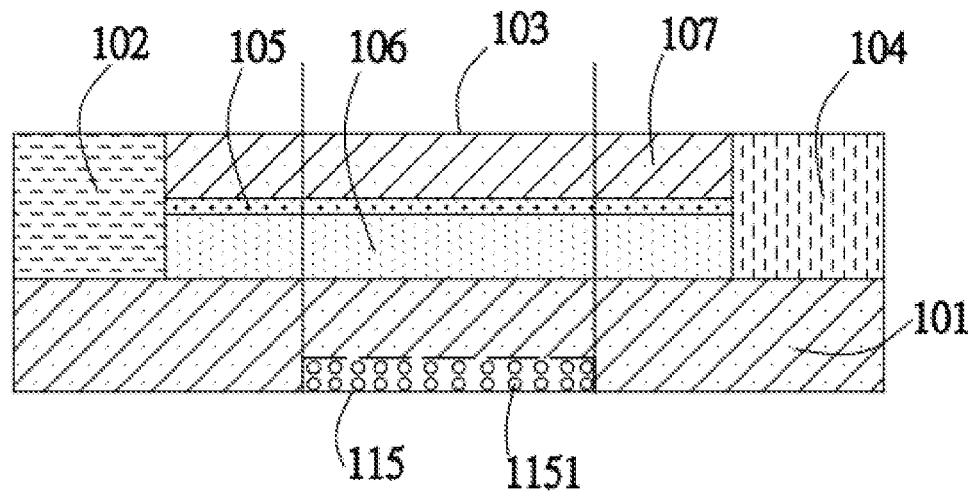

As shown in FIG. 4F, after the glass 112 and the carbonized layer 115 are laser-peeled, the carbonized layer 115 is cleaned to remove the nanoparticles 1131 remaining in the carbonized layer 115 and the nanoparticles 1131 around the carbonized layer 115, thereby forming the patterned holes 1081 in the lowest layer of the flexible substrate 101, wherein the patterned holes 1081 are the buffer layer 108.

Furthermore, the size of the patterned holes 1081 is 1 to 2 times the size of the nanoparticles 1131. When the bending region 103 is bent, the PI materials on both sides of the buffer layer 108 fills the inside of the patterned hole 1081, thereby effectively reducing the stress received when the flexible substrate 101 and improving the bending resistance of the bending region 103, and thereby improving the service life of the OLED display panel. 100.

Furthermore, the position of the neutral layer 109 of the bending region 103 can be adjusted into the signal routing layer 105 by adjusting parameters such as the size, depth, and density of the patterned holes 1081, thereby further enhancing the bending resistance of the signal routing layer 105 in the bending region 103.

S304: laminating the first backplate 110 and the second backplate 111 over the flexible substrate 101, wherein the first backplate 110 and the second backplate 111 are attached to two ends of the buffer layer 108, respectively.

Figure 4G:
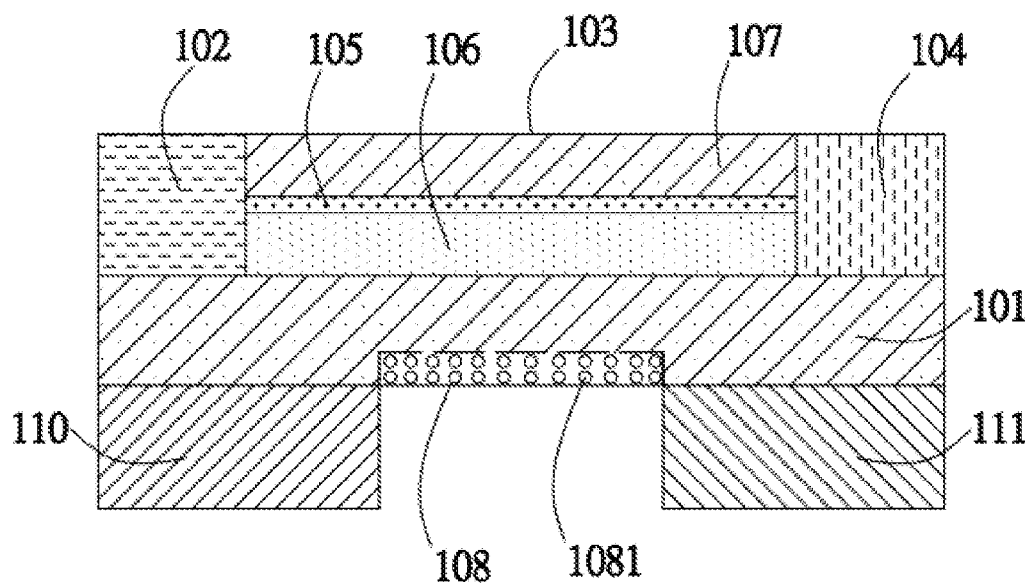

As shown in FIG. 4G, the first backplate 110 and the second backplate 111 are respectively located at two ends of the buffer layer 108, that is, the pitch between the first backplate 110 and the second backplate 111 is the length of the bending region 103, and the length of the bending region 103 depends on its bending radius.

Referring to FIG. 2 again, after the bending region 103 is bent, the buffer layer 108 reduces the thickness of the flexible substrate 101 disposed in the bending region 103, thereby reducing the thickness of the flexible substrate 101. The Young's modulus of the flexible substrate 101 of the bending region 103 leads the position of the neutral layer 109 of the bending region 103 to moving into the signal wiring layer 105 so that the stress of the signal traces in the signal wiring layer 105 is zero, thereby reducing the risk of the signal trace breaking.

Embodiment 3

Figure 5:
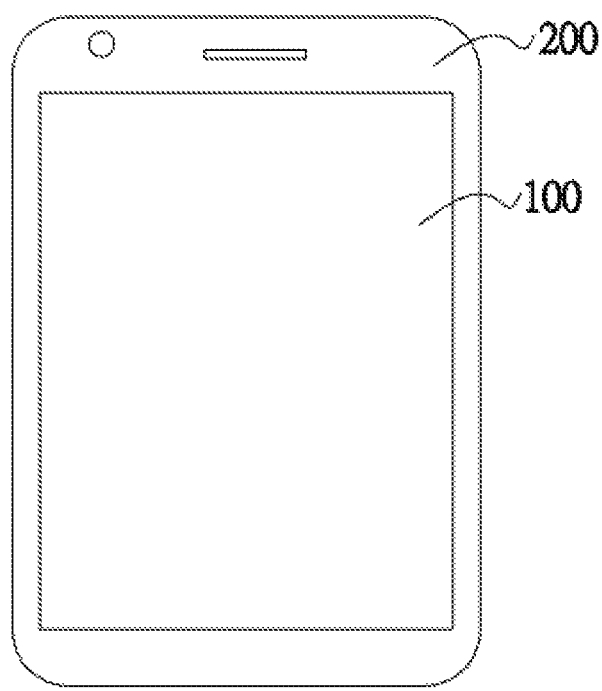
FIG. 5 is a schematic structural diagram of a display device according to a third embodiment of the present invention.

As shown in FIG. 5, an embodiment of the present invention further provides a display device 200. The display device 200 comprises the OLED display panel 100 in Embodiment 1. The display device 200 may be display devices such as a television, a mobile phone, or a notebook, computers and smart wearable display devices, and may also be other display devices. The display device 200 has all the beneficial effects of the OLED display panel 100 and is not repeated here.

The beneficial effects of the present invention are that the OLED display panel provided by the present invention and the method thereof are provided with a buffer layer composed of a patterned cavity over a flexible substrate corresponding to the bending area to adjust the neutral layer into a signal routing layer to prevent the signal wiring from stress damage and breakage, which improves the bending resistance of the bending area, thereby improving the service life of the OLED display panel.

While the present disclosure has been described with the aforementioned preferred embodiments, it is preferable that the above embodiments should not be construed as limiting of the present disclosure. Anyone having ordinary skill in the art can make a variety of modifications and variations without departing from the spirit and scope of the present disclosure as defined by the following claims.

What is claimed is:

1. An organic light-emitting diode (OLED) display panel, comprising:
    a flexible substrate, comprising a display area defined over a front surface of the flexible substrate, a bending region located at one end of the display area, and a binding region located over a back surface of the flexible substrate, wherein the bending region is configured to be bendable to the binding region, a signal wiring layer is provided in the bending region, the signal wiring layer connects the display area and the binding region, and the signal wiring layer comprises a plurality of signal wires; and
    wherein a buffer layer is disposed at a side of the flexible substrate facing away from the signal wiring layer and under the flexible substrate at a position corresponding to the bending region, and the buffer layer is configured to adjust a position of a neutral layer of the bending region into the signal wiring layer and comprises a plurality of patterned holes.

2. The OLED display panel according to claim 1, wherein the OLED display panel further comprises a first backplate and a second backplate, wherein the first backplate and the second backplate are disposed over the back surface of the flexible substrate, and the first backplate and the second backplate are respectively disposed at two ends of the buffer layer.

3. The OLED display panel according to claim 2, wherein the first backplate and the second backplate are made of polyethylene terephthalate.

4. The OLED display panel according to claim 1, wherein the flexible substrate is made of polyimide.

5. An organic light-emitting diode (OLED) display panel, comprising:
    a flexible substrate, comprising a display area defined over a front surface of the flexible substrate, a bending region located at one end of the display area, and a binding region located over a back surface of the flexible substrate, wherein the bending region is configured to be bendable to the binding region, and a signal wiring layer is provided in the bending region; and wherein a buffer layer is disposed at a side of the flexible substrate facing away from the signal wiring layer and under the flexible substrate at a position corresponding to the bending region, and the buffer layer is configured to adjust a position of a neutral layer of the bending region into the signal wiring layer and comprises a plurality of patterned holes.

6. The OLED display panel according to claim 5, wherein the OLED display panel further comprises a first backplate and a second backplate, wherein the first backplate and the second backplate are disposed over the back surface of the flexible substrate, and the first backplate and the second backplate are respectively disposed at two ends of the buffer layer.

7. The OLED display panel according to claim 6, wherein the first backplate and the second backplate are made of polyethylene terephthalate.

8. The OLED display panel according to claim 5, wherein the flexible substrate is made of polyimide.

9. A method for fabricating an organic light-emitting diode (OLED) display panel, comprising following steps:
    S10: fabricating a sacrificial layer over a glass corresponding to a bending region, wherein the sacrificial layer comprises a plurality of nanoparticles, and a flexible substrate is fabricated over the sacrificial layer and the glass;
    S20: fabricating a film structure of the OLED display panel comprising a signal wiring layer over the flexible substrate;
    S30: forming a buffer layer over the flexible substrate at a position corresponding to the bending region, wherein the buffer layer is configured to adjust a position of a neutral layer of the bending region into the signal wiring layer; and S40: laminating a first backplate and a second backplate over the flexible substrate, wherein the first backplate and the second backplate are attached to two ends of the buffer layer, respectively.

10. The method for fabricating the OLED display panel according to claim 9, wherein in the step S10, the plurality of nanoparticles are doped in a polyimide solution and the sacrificial layer is formed by coating thereof.

11. The method for fabricating the OLED display panel according to claim 9, wherein the step S30 comprises:
   S301: performing a laser scanning irradiation on the sacrificial layer, transforming the sacrificial layer into a carbonized layer, and peeling the carbonized layer and the glass;
   S302: scanning the OLED display panel with a laser, and separating the glass from the flexible substrate; and
   S303: cleaning the carbonized layer, forming a plurality of patterned holes over the flexible substrate, wherein the plurality of patterned holes are the buffer layer.

12. The method for fabricating the OLED display panel according to claim 11, wherein a size of the patterned holes in the buffer layer is 1 to 2 times a size of the nanoparticles.

13. The method for fabricating the OLED display panel according to claim 11, wherein the laser is an ultraviolet laser.

14. The method for fabricating the OLED display panel according to claim 9, wherein a thickness of the sacrificial layer is 100 nm to 10 μm.

* * * * *